United States Patent
Nakano

(10) Patent No.: US 10,686,067 B2
(45) Date of Patent: *Jun. 16, 2020

(54) SEMICONDUCTOR DEVICE, AND METHOD FOR MANUFACTURING THE SAME

(71) Applicant: Rohm Co., Ltd., Kyoto-shi, Kyoto (JP)

(72) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/379,038

(22) Filed: Apr. 9, 2019

(65) Prior Publication Data

US 2019/0237578 A1    Aug. 1, 2019

Related U.S. Application Data

(63) Continuation of application No. 15/332,624, filed on Oct. 24, 2016, now Pat. No. 10,290,733, which is a
(Continued)

(30) Foreign Application Priority Data

Mar. 26, 2008 (JP) .................................. 2008-080216
Dec. 26, 2008 (JP) .................................. 2008-333530

(51) Int. Cl.
*H01L 29/78* (2006.01)
*H01L 29/06* (2006.01)
(Continued)

(52) U.S. Cl.
CPC ...... *H01L 29/7813* (2013.01); *H01L 21/0465* (2013.01); *H01L 29/063* (2013.01);
(Continued)

(58) Field of Classification Search
None
See application file for complete search history.

(56) References Cited

U.S. PATENT DOCUMENTS 4,945,394 A * 7/1990 Palmour ............. H01L 29/1608
257/586
5,168,331 A  12/1992 Yilmaz
(Continued)

FOREIGN PATENT DOCUMENTS

EP  0 889 511   1/1999
EP  1 359 624   11/2003
(Continued)

OTHER PUBLICATIONS

Search Report issued in corresponding European Patent Application No. 15181700.4, dated Dec. 1, 2015 (3 pages).
(Continued)

*Primary Examiner* — Anthony Ho
*Assistant Examiner* — Kevin Quinto
(74) *Attorney, Agent, or Firm* — Hamre, Schumann, Mueller & Larson, P.C.

(57) ABSTRACT

A semiconductor device (A1) includes a semiconductor layer having a first face with a trench (3) formed thereon and a second face opposite to the first face, a gate electrode (41), and a gate insulating layer (5). The semiconductor layer includes a first n-type semiconductor layer (11), a second n-type semiconductor layer (12), a p-type semiconductor layer (13), and an n-type semiconductor region (14). The trench (3) is formed so as to penetrate through the p-type semiconductor layer (13) and to reach the second n-type semiconductor layer (12). The p-type semiconductor layer (13) includes an extended portion extending to a position closer to the second face of the semiconductor layer than the trench (3) is. Such structure allows suppressing dielectric breakdown in the gate insulating layer (5).

12 Claims, 9 Drawing Sheets

Related U.S. Application Data continuation of application No. 14/854,752, filed on Sep. 15, 2015, now Pat. No. 9,496,387, which is a continuation of application No. 13/614,510, filed on Sep. 13, 2012, now Pat. No. 9,166,038, which is a continuation of application No. 12/934,012, filed as application No. PCT/JP2009/056109 on Mar. 26, 2009, now Pat. No. 8,283,721.

(51) Int. Cl.
| | | |
|---|---|---|
| *H01L 29/10* | (2006.01) | |
| *H01L 29/66* | (2006.01) | |
| *H01L 29/36* | (2006.01) | |
| *H01L 29/423* | (2006.01) | |
| *H01L 21/04* | (2006.01) | |
| *H01L 29/16* | (2006.01) | |
| *H01L 29/417* | (2006.01) | |

(52) U.S. Cl.
CPC ...... *H01L 29/0623* (2013.01); *H01L 29/1095* (2013.01); *H01L 29/1608* (2013.01); *H01L 29/36* (2013.01); *H01L 29/4236* (2013.01); *H01L 29/66068* (2013.01); *H01L 29/66727* (2013.01); *H01L 29/66734* (2013.01); *H01L 29/7827* (2013.01); *H01L 29/41766* (2013.01)

(56) References Cited

U.S. PATENT DOCUMENTS

| | | | |
|---|---|---|---|
| 5,689,128 | A | 11/1997 | Hshieh et al. |
| 5,910,669 | A | 6/1999 | Chang et al. |
| 6,342,709 | B1 | 1/2002 | Sugawara et al. |
| 6,400,003 | B1 | 6/2002 | Huang |
| 6,919,599 | B2 | 7/2005 | Henson |
| 8,283,721 | B2 | 10/2012 | Nakano |
| 9,166,038 | B2 | 10/2015 | Nakano |
| 9,496,387 | B2 | 11/2016 | Nakano |
| 10,290,733 | B2 * | 5/2019 | Nakano ............... H01L 29/0623 |
| 2006/0076614 | A1 | 4/2006 | Ninomiya |
| 2006/0214222 | A1 | 9/2006 | Challa et al. |
| 2006/0267090 | A1 | 11/2006 | Sapp et al. |
| 2007/0013000 | A1 | 1/2007 | Shiraishi |
| 2007/0093019 | A1 | 4/2007 | Rieger et al. |
| 2007/0194375 | A1 | 8/2007 | Kawaguchi et al. |
| 2008/0230787 | A1 | 9/2008 | Suzuki et al. |

FOREIGN PATENT DOCUMENTS

| | | |
|---|---|---|
| JP | 1-192174 | 8/1989 |
| JP | 05-082792 | 4/1993 |
| JP | 6-224437 | 8/1994 |
| JP | 10-098188 | 4/1998 |
| JP | 10-321848 | 12/1998 |
| JP | 11-501459 | 2/1999 |
| JP | 2001-267570 | 9/2001 |
| JP | 2002-531940 | 9/2002 |
| JP | 2005-5655 | 1/2006 |
| JP | 2006-93430 | 4/2006 |
| WO | WO 97/47045 | 12/1997 |
| WO | WO 2007/122646 | 11/2007 |

OTHER PUBLICATIONS

Narazaki et al. "A marvelous low on-resistance 20V rated self alignment trench MOSFET (SAT-MOS) in a 0.35/spl mu/m LSI design rule with both high forward blocking voltage yield and large current capability", Power Semiconductor Devices and ICS, 2004 Proceedings of the 16th International Symposium on Power Semiconductor Devices and ICs, Kiitakyushu, p. 393-396, May 24, 2004.
Summons to attend oral proceedings received in the corresponding European Patent application, Nov. 20, 2018 (8 pages).

* cited by examiner

SEMICONDUCTOR DEVICE, AND METHOD FOR MANUFACTURING THE SAME

TECHNICAL FIELD

The present invention relates to a semiconductor device having a trench structure, and also to a method of manufacturing such a semiconductor device.

BACKGROUND ART

FIG. 12 illustrates an example of a cross-section of a conventional vertically stacked insulated-gate semiconductor device that includes a trench structure. The semiconductor device 9A includes a first n-type semiconductor layer 911, a second n-type semiconductor layer 912, a p-type semiconductor layer 913, an n-type semiconductor region 914, a trench 93, a gate electrode 94 and a gate insulating layer 95.

The first n-type semiconductor layer 911 serves as the base of the semiconductor device 9A. The second n-type semiconductor layer 912 is provided on the first n-type semiconductor layer 911. The p-type semiconductor layer 913 is provided on the second n-type semiconductor layer 912. The n-type semiconductor region 914 is provided on the p-type semiconductor layer 913.

The trench 93 is formed so as to penetrate through the n-type semiconductor region 914 and the p-type semiconductor layer 913, and to reach the second n-type semiconductor layer 912. Inside the trench 93, the gate electrode 94 and the gate insulating layer 95 are located. The gate insulating layer 95 serves to insulate the gate electrode 94 from the second n-type semiconductor layer 912, the p-type semiconductor layer 913, and the n-type semiconductor region 914. The gate insulating layer 95 is formed along the inner wall of the trench 93.

In the semiconductor device 9A thus configured, when a reverse bias is applied, field concentration takes place on the bottom portion of the gate insulating layer 95. The field concentration may provoke dielectric breakdown of the gate insulating layer 95.

Patent document 1: JP-A-H01-192174

DISCLOSURE OF THE INVENTION

Problem to be Solved by the Invention

The present invention has been accomplished under the foregoing situation, with an object to provide a semiconductor device that can suppress the dielectric breakdown in the insulating layer, and a method of manufacturing such semiconductor device.

Means for Solving the Problem

A first aspect of the present invention provides a semiconductor device comprising a semiconductor layer having a first face with a trench formed thereon and a second face opposite to the first face; a gate electrode provided in the trench; and an insulating layer provided in the trench so as to insulate the semiconductor layer and the gate electrode from each other; wherein the semiconductor layer includes a first semiconductor layer having a first conductivity type, and a second semiconductor layer having a second conductivity type opposite to the first conductivity type; the trench is formed so as to penetrate through the second semiconductor layer and to reach the first semiconductor layer; and the second semiconductor layer includes an extended portion extending to a position closer to the second face of the semiconductor layer than the trench is.

In a preferred embodiment of the present invention, the second semiconductor layer may include a channel region formed along the trench and located in contact with the first semiconductor layer, and impurity concentration in the channel region may be lower than that in the extended portion.

In a preferred embodiment of the present invention, the semiconductor layer may further include a semiconductor region formed around the trench; one of the first semiconductor layer, the second semiconductor layer, and the semiconductor region may include a recessed portion; and the extended portion and the recessed portion may be disposed so as to overlap in a widthwise direction perpendicular to a depthwise direction of the trench.

In a preferred embodiment of the present invention, the semiconductor layer may further include an additional semiconductor region having the second conductivity type; and the additional semiconductor region may be formed in the first semiconductor layer at a position spaced from the second semiconductor layer.

In a preferred embodiment of the present invention, the additional semiconductor region may be located in contact with a bottom portion of the trench.

In a preferred embodiment of the present invention, the additional semiconductor region may be formed over an area including the bottom portion of the trench and a lateral portion of the trench.

In a preferred embodiment of the present invention, the additional semiconductor region may be located in contact with the trench, and a boundary between the additional semiconductor region and the trench may be located only inside an opening of the trench, in a depthwise view of the trench.

A second aspect of the present invention provides a method of manufacturing a semiconductor device, comprising forming a trench and a recessed portion on a surface of a semiconductor substrate; forming an insulating layer in the trench; forming a gate electrode over the insulating layer and inside the trench; irradiating the recessed portion with ion thereby forming a first semiconductor region having a different conductivity type from that of the semiconductor substrate, at a position adjacent to a bottom portion of the recessed portion; and irradiating the surface of the semiconductor substrate with ion thereby forming a second semiconductor region having a different conductivity type from that of the semiconductor substrate; wherein the first and the second semiconductor region are formed in connection with each other; and the trench is formed so as to penetrate through the second semiconductor region.

Other features and advantages of the present invention will become more apparent through detailed description given below referring to the accompanying drawings.

BEST MODE FOR CARRYING OUT THE INVENTION

Figure 1:
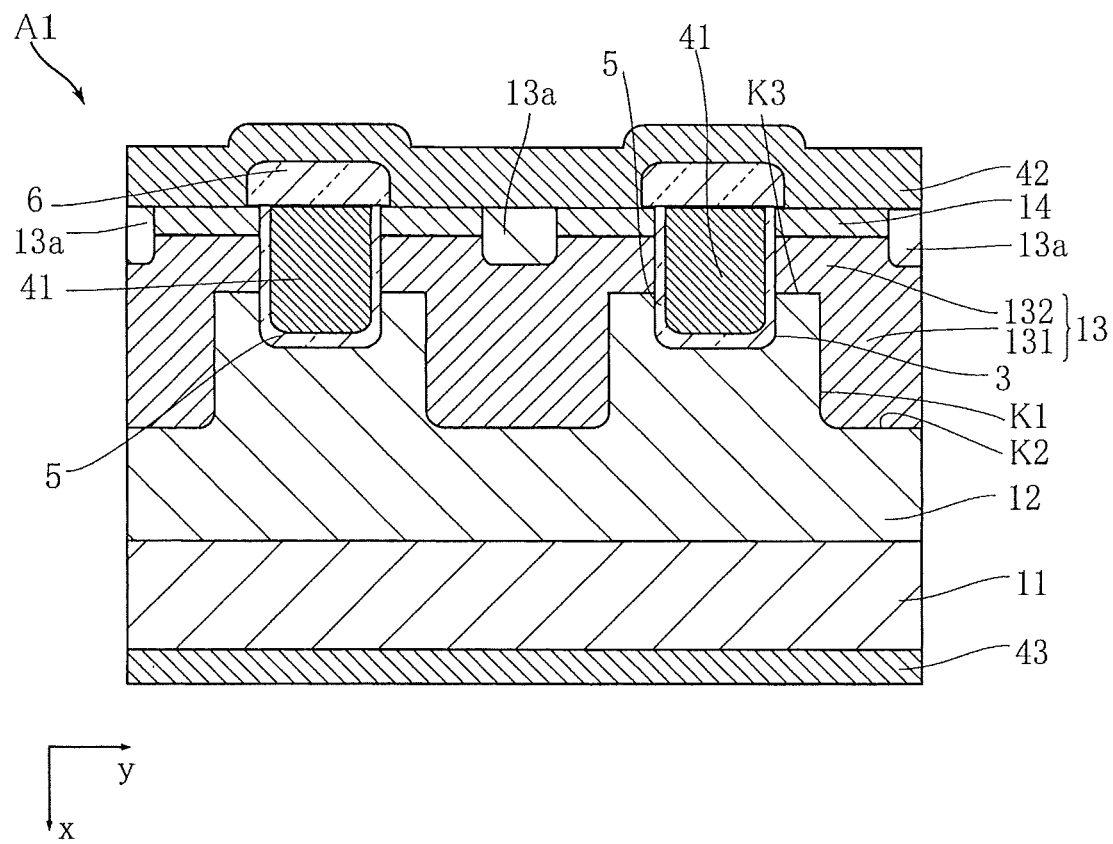
FIG. 1 is a fragmentary cross-sectional view of a semiconductor device according to a first embodiment of the present invention.

Hereunder, preferred embodiments of the present invention will be described in details, referring to the drawings.

FIG. 1 illustrates a semiconductor device according to a first embodiment of the present invention. The semiconductor device A1 according to this embodiment includes a first n-type semiconductor layer 11, a second n-type semiconductor layer 12, a p-type semiconductor layer 13, an n-type semiconductor region 14, a high-concentration p-type semiconductor region 13a, a trench 3, a gate electrode 41, a gate insulating layer 5, a source electrode 42, a drain electrode 43 and an interlayer dielectric 6.

The first n-type semiconductor layer 11 is a substrate constituted of silicon carbide with a high-concentration impurity added thereto. The second n-type semiconductor layer 12 is provided on the first n-type semiconductor layer 11. The second n-type semiconductor layer 12 is constituted of silicon carbide with a low-concentration impurity added thereto.

The p-type semiconductor layer 13 includes a first p-type semiconductor layer 131 and a second p-type semiconductor layer 132. The first p-type semiconductor layer 131 is provided on the second n-type semiconductor layer 12. Of the boundary between the first p-type semiconductor layer 131 and the second n-type semiconductor layer 12, a portion along a depthwise direction x of the trench 3 will be referred to as a lateral boundary K1, and a portion along a widthwise direction y will be referred to as a bottom boundary K2. In this embodiment, the bottom boundary K2 is spaced from the boundary between the n-type semiconductor region 14 and the source electrode 42, by approximately 1 μm. The impurity concentration of the first p-type semiconductor layer 131 is, for example, $1\times10^{17}$ $cm^{-3}$ to $1\times10^{20}$ $cm^{-3}$. The second p-type semiconductor layer 132 is provided on the first p-type semiconductor layer 131 and the second n-type semiconductor layer 12. Of the boundary between the second p-type semiconductor layer 132 and the second n-type semiconductor layer 12, a portion along the widthwise direction y will be referred to as a bottom boundary K3. The impurity concentration of the second p-type semiconductor layer 132 is, for example, $1\times10^{16}$ $cm^{-3}$ to $1\times10^{19}$ $cm^{-3}$. The n-type semiconductor region 14 is provided on the p-type semiconductor layer 13. The high-concentration p-type semiconductor region 13a is provided on the first p-type semiconductor layer 131.

The trench 3 is formed so as to penetrate through the n-type semiconductor region 14 and the second p-type semiconductor layer 132, and to reach the second n-type semiconductor layer 12. The trench 3 and the first p-type semiconductor layer 131 are spaced from each other by approximately 0.3 μm, when viewed in the widthwise direction y.

Inside the trench 3, the gate electrode 41 and the gate insulating layer 5 are located. The gate electrode 41 is constituted of, for example, polysilicon. Alternatively, a metal such as aluminum may be employed to form the gate electrode 41. The gate insulating layer 5 is constituted of silicon dioxide for example, and serves to insulate the gate electrode 41 from the second n-type semiconductor layer 12, the p-type semiconductor layer 13, and the n-type semiconductor region 14. The gate insulating layer 5 is provided along the inner wall of the trench 3 and over the bottom portion and the lateral portion of the trench 3.

In the depthwise direction x, the bottom boundary K3, the bottom portion of the gate electrode 41, the bottom portion of the trench 3, and the bottom boundary K2 are located in the mentioned order, downwardly in FIG. 1.

The source electrode 42 is for example constituted of aluminum, and located in contact with the n-type semiconductor region 14 and the high-concentration p-type semiconductor region 13a. The drain electrode 43 is also constituted of aluminum for example, and located in contact with the first n-type semiconductor layer 11. The drain electrode 43 is provided on the opposite side of the first n-type semiconductor layer 11 to the second n-type semiconductor layer 12. The interlayer dielectric 6 is formed so as to cover the gate electrode 41.

Now, an example of the manufacturing method of the semiconductor device A1 will be described, referring to FIGS. 2 and 3.

Figure 2:
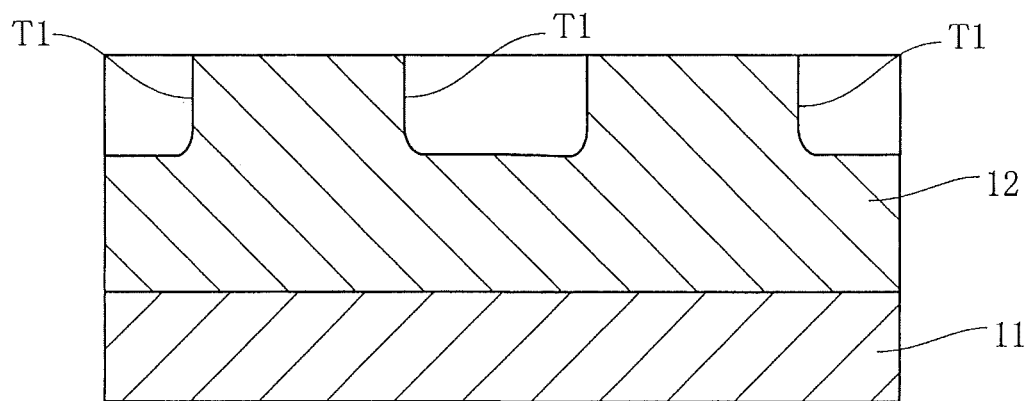
FIG. 2 is a fragmentary cross-sectional view for explaining a manufacturing process of the semiconductor device shown in FIG. 1.

Referring first to FIG. 2, a semiconductor substrate which is to serve as the first n-type semiconductor layer 11 is prepared. On the upper surface of the substrate, the second n-type semiconductor layer 12 is formed through epitaxial crystal growth. Then a groove T1 is formed on the surface of the second n-type semiconductor layer 12.

Figure 3:
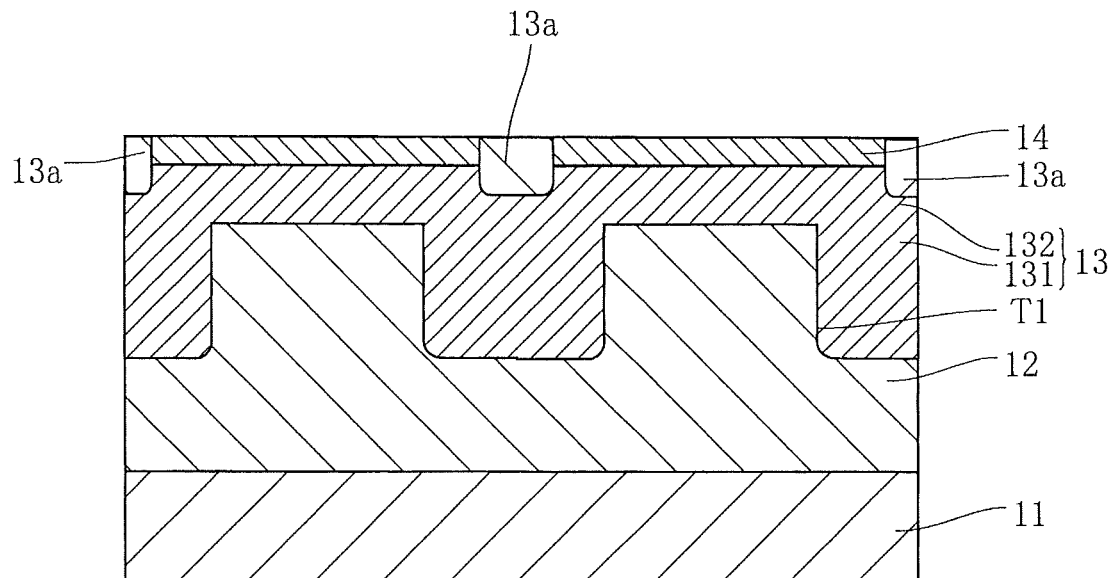
FIG. 3 is a fragmentary cross-sectional view for explaining a manufacturing process following the state shown in FIG. 2.

Referring then to FIG. 3, the first p-type semiconductor layer 131 is formed inside the groove T1 through the epitaxial crystal growth. The surface of the substrate is then planarized. On the planarized substrate, the second p-type semiconductor layer 132 is formed through the epitaxial crystal growth.

Then a mask of a predetermined pattern is placed over the upper surface of the second p-type semiconductor layer 132, and impurity ions (n-type or p-type) are injected. Thus the n-type semiconductor region 14 and the high-concentration p-type semiconductor region 13a are formed.

The above is followed by the formation of the trench 3, the gate insulating layer 5 and the gate electrode 41 shown in FIG. 1. Then the interlayer dielectric 6, the source electrode 42, and the drain electrode 43 are formed. Through the foregoing process, the semiconductor device A1 can be obtained.

The advantageous effects of the semiconductor device A1 will now be described hereunder. In this embodiment, the bottom boundary K2 is at a lower level than the bottom portion of the trench 3, according to the orientation of FIG. 1. Such configuration encourages the field concentration on the boundary between the first p-type semiconductor layer 131 and the second n-type semiconductor layer 12. Accordingly, the field concentration on the bottom portion of the trench 3 is mitigated. Mitigating the field concentration reduces the risk of dielectric breakdown in the gate insulating layer 5. As a result, the withstand voltage of the semiconductor device A1 can be improved.

The structure according to this embodiment allows reducing the impurity concentration of the second p-type semiconductor layer 132. This facilitates lowering the threshold voltage of the semiconductor device A1. On the other hand, increasing the impurity concentration of the first p-type semiconductor layer 131 allows suppressing extension of a depletion layer in the first p-type semiconductor layer 131, thereby preventing a punch through phenomenon.

Figure 4:
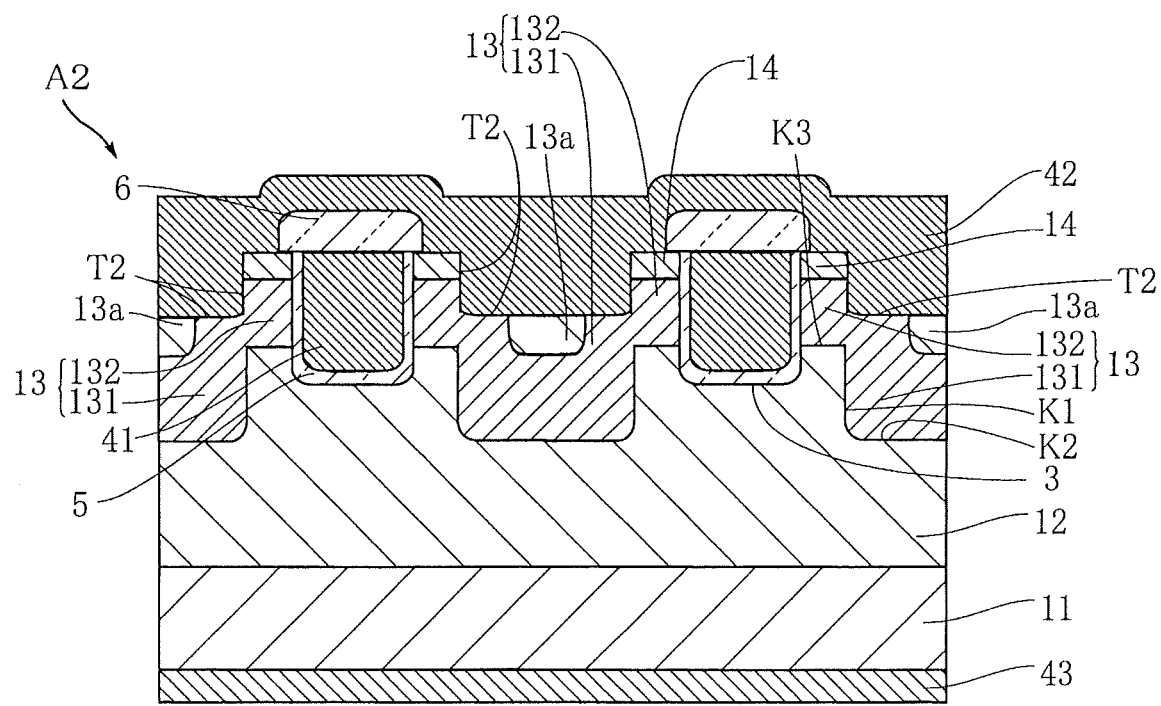
FIG. 4 is a fragmentary cross-sectional view of a semiconductor device according to a second embodiment of the present invention.
Figure 5A:
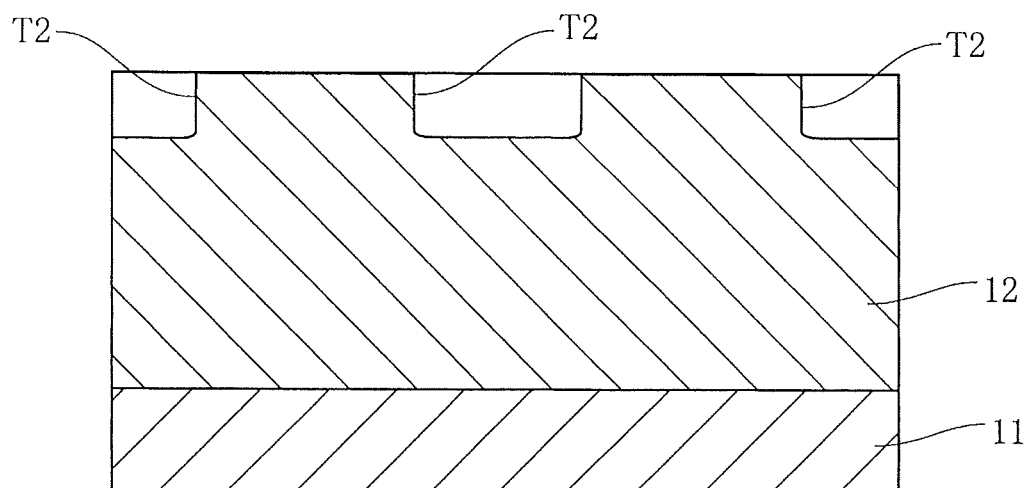
FIG. 5A is a fragmentary cross-sectional view for explaining a manufacturing process of the semiconductor device shown in FIG. 4.
Figure 5B:
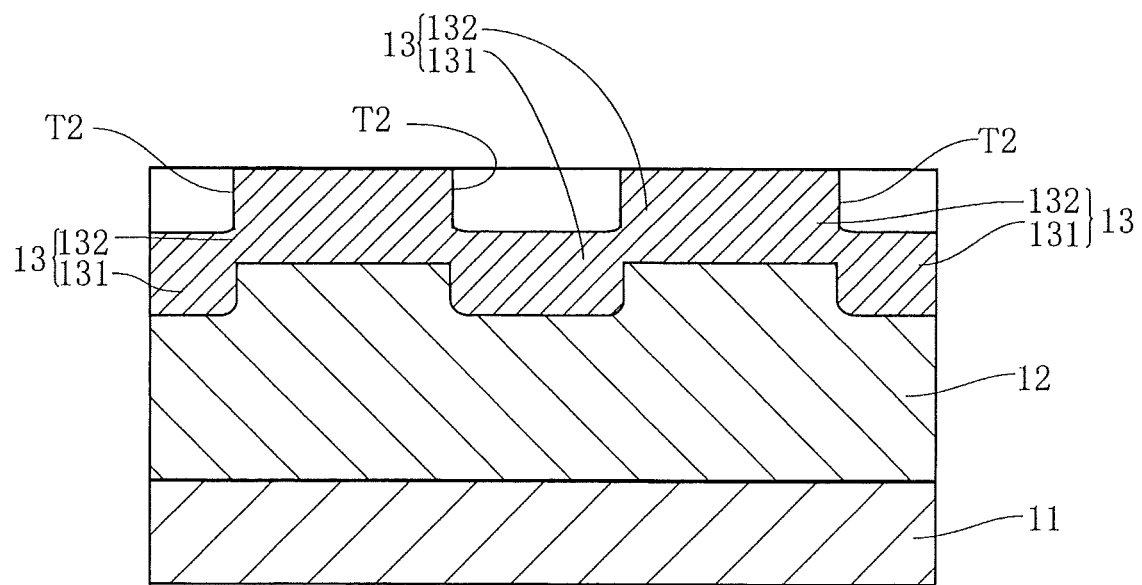
FIG. 5B is a fragmentary cross-sectional view for explaining a manufacturing process following the state shown in FIG. 5A.

FIGS. 4, 5A and 5B illustrate a second embodiment of the present invention. In these drawings, the constituents same as or similar to those of the foregoing embodiment are given the same numeral. The semiconductor device A2 according to this embodiment is different from the semiconductor device A1 according to the first embodiment in including a recessed portion T2.

In the semiconductor device A2 shown in FIG. 4, the impurity concentration in the first p-type semiconductor layer 131 is higher than that in the second p-type semiconductor layer 132, as in the first embodiment.

Above the first p-type semiconductor layer 131 according to the orientation of FIG. 4, a recessed portion T2 is provided. In this embodiment, the size of the opening of the recessed portion T2 in the widthwise direction y is slightly smaller than that of the first p-type semiconductor layer 131 in the widthwise direction. y. The bottom portion of the recessed portion T2 is located higher than the bottom boundary K2, according to FIG. 4. Also, the bottom portion of the recessed portion T2 is located higher than the bottom boundary K3 in FIG. 4. The high-concentration p-type semiconductor region 13a is located below the recessed portion T2. It is not mandatory that the bottom portion of the recessed portion T2 is located higher than the bottom boundary K3. For example, the bottom portion of the recessed portion T2 may be located lower than the bottom portion of the trench 3. The position of the bottom portion of the recessed portion T2 may be determined irrespective of the position of the bottom boundary K3 and the bottom portion of the trench 3.

Referring now to FIGS. 5A and 5B, an example of the manufacturing method of the semiconductor device A2 will be described hereunder.

First, as shown in FIG. 5A, a semiconductor substrate which is to serve as the first n-type semiconductor layer 11 is prepared. On the upper surface of the substrate, the second n-type semiconductor layer 12 is formed through the epitaxial crystal growth. Then the recessed portion T2 is formed on the surface of the second n-type semiconductor layer 12, in a depth of approximately 0.5 μm.

Referring then to FIG. 5B, the first p-type semiconductor layer 131 is formed. To form the first p-type semiconductor layer 131, a mask (not shown) is placed over the upper surface of the substrate, and the recessed portion T2 is irradiated with impurity ions (p-type) from above in FIG. 5B, with energy of approximately 400 KeV. Then the region on the surface of the second n-type semiconductor layer 12 where the recessed portion T2 is not formed is irradiated with impurity ions (p-type), with generally the same energy. As a result, the second p-type semiconductor layer 132 is formed. Here, the ion concentration in the first p-type semiconductor layer 131 and the second p-type semiconductor layer 132 can be controlled by adjusting the duration of the ion irradiation.

Alternatively, the entire surface of the second n-type semiconductor layer 12 may be irradiated with impurity ions from above in FIG. 5B, without putting the mask on the upper surface of the substrate. By such impurity ion irradiation, the first p-type semiconductor layer 131 and the second p-type semiconductor layer 132 can be formed in different depths from the surface of the second n-type semiconductor layer 12. This process is especially useful in the case where it is not necessary to control the impurity concentration in the first p-type semiconductor layer 131 and the second p-type semiconductor layer 132.

The above is followed by the formation of the n-type semiconductor region 14 and the high-concentration p-type semiconductor region 13a shown in FIG. 4. These regions can also be formed by injecting impurity ions (n-type or p-type) to the second n-type semiconductor layer 12. Then the trench 3 is formed in the region where the second p-type semiconductor layer 132 has been formed. Inside the trench 3, the gate insulating layer 5 and the gate electrode 41 are formed. Then the interlayer dielectric 6, the source electrode 42, and the drain electrode 43 are formed. Through the foregoing process, the semiconductor device A2 can be obtained.

According to this embodiment, providing the recessed portion T2 allows forming a deeper portion of the first p-type semiconductor layer 131 by the ion irradiation with lower energy.

Figure 6:
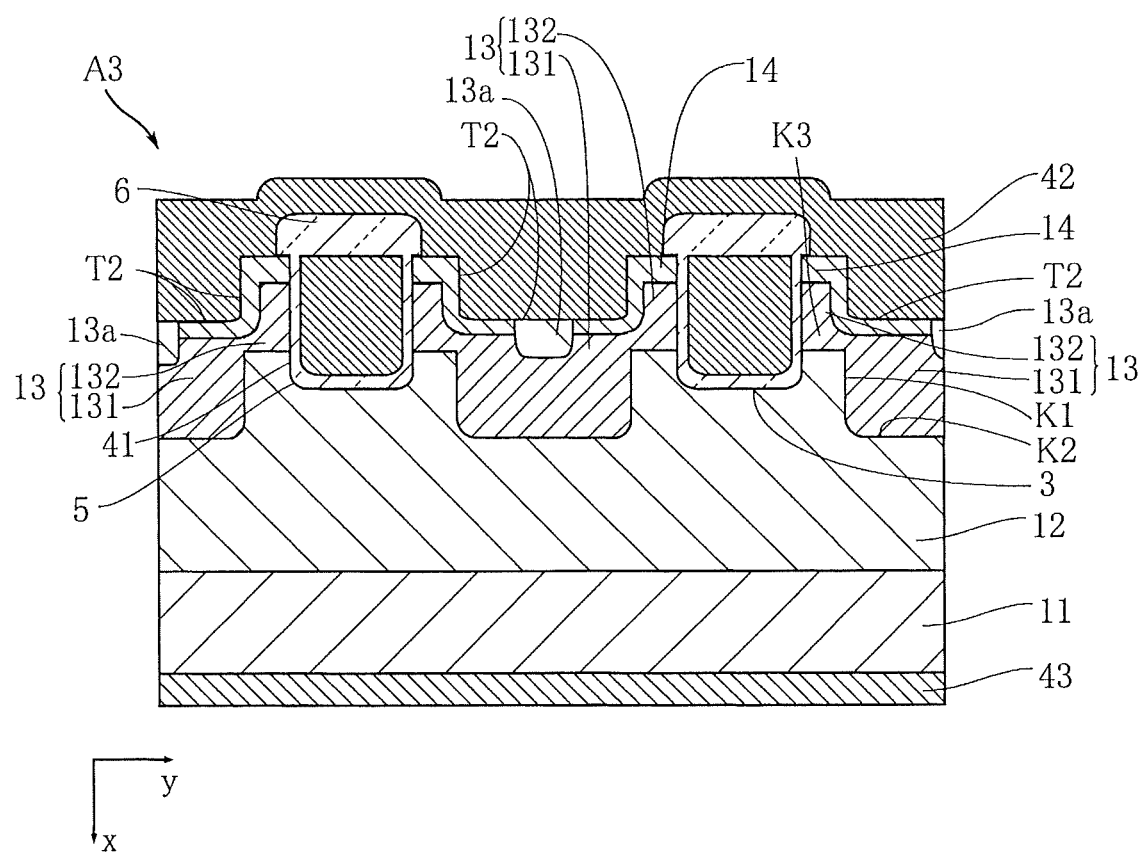
FIG. 6 is a fragmentary cross-sectional view of a semiconductor device according to a third embodiment of the present invention.

FIG. 6 illustrates a third embodiment of the present invention. As in the preceding drawings, the constituents in FIG. 6 same as or similar to those of the foregoing embodiments are given the same numeral. The semiconductor device A3 according to this embodiment is different from the semiconductor device A2 according to the second embodiment in that the n-type semiconductor region is also provided under the recessed portion T2. Such configuration increases the contact area between the source electrode 42 and the n-type semiconductor region 14. Accordingly, the contact resistance between the source electrode 42 and the n-type semiconductor region 14 can be reduced, in the semiconductor device A3.

FIGS. 7 to 10 illustrate a fourth embodiment of the present invention. In these drawings, the constituents same as or similar to those of the foregoing embodiments are given the same numeral. The semiconductor device A4 according to this embodiment is different from the semiconductor device A1 according to the first embodiment in including a p-type semiconductor region 15.

Figure 7:
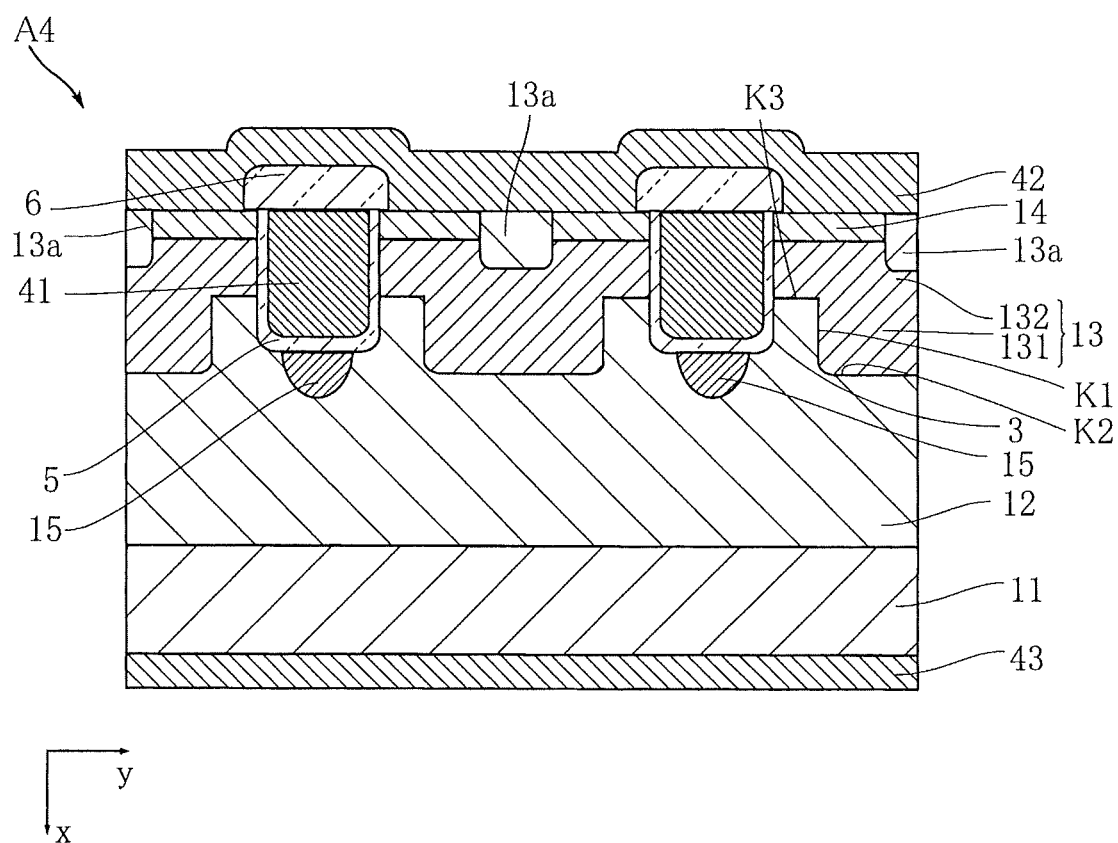
FIG. 7 is a fragmentary cross-sectional view of a semiconductor device according to a fourth embodiment of the present invention.

As is apparent in FIG. 7, the p-type semiconductor region 15 is located in contact with the bottom portion of the trench 3. The impurity concentration in the p-type semiconductor region 15 is, for example, $1 \times 10^{16}$ cm$^{-3}$ to $1 \times 10^{21}$ cm$^{-3}$. The size of the boundary between the p-type semiconductor region 15 and the bottom portion of the trench 3 in the widthwise direction y is slightly smaller than that of the gate electrode 41 in the widthwise direction y. Also, a lowermost portion of the p-type semiconductor region 15 according to the orientation of FIG. 7 is located lower than the bottom boundary K2 in the depthwise direction x. Conversely, although not shown, the bottom boundary K2 may be located lower than the lowermost portion of the p-type semiconductor region 15.

Figure 9A:
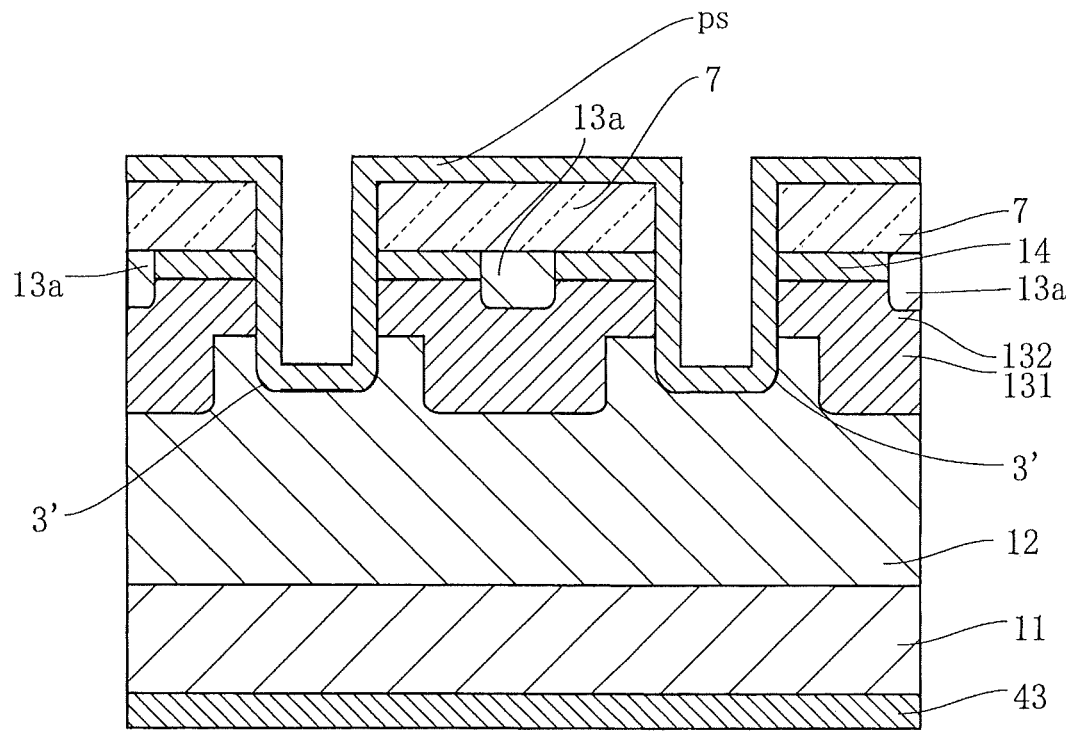
FIG. 9A is a fragmentary cross-sectional view for explaining a manufacturing process following the state shown in FIG. 8B.
Figure 9B:
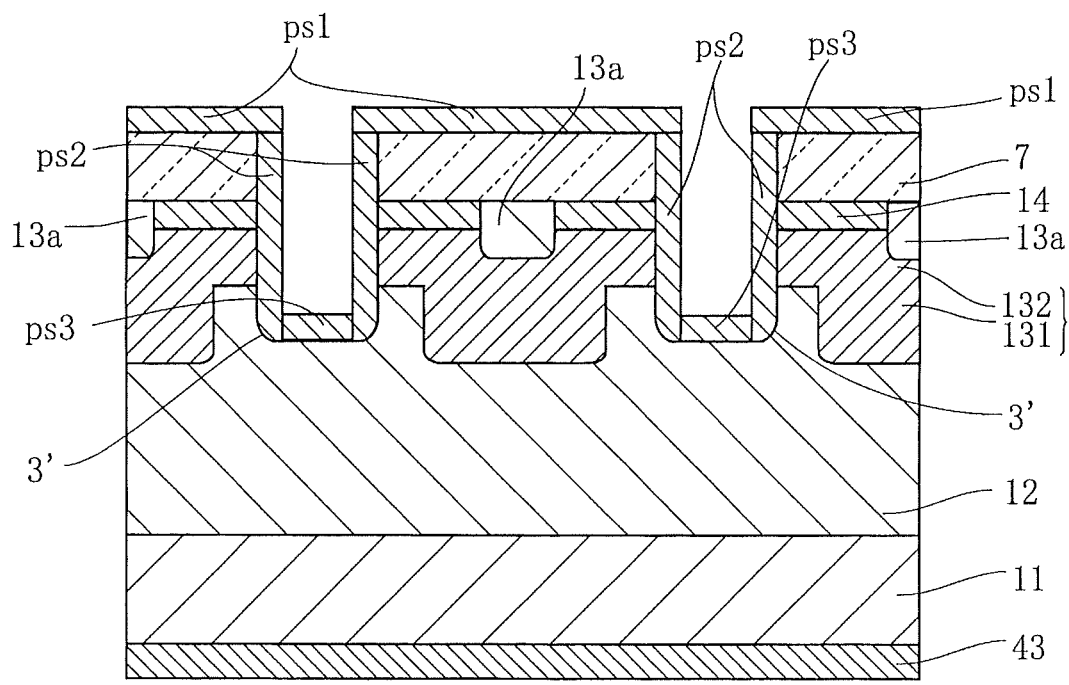
FIG. 9B is a fragmentary cross-sectional view for explaining a manufacturing process following the state shown in FIG. 9A.
Figure 10:
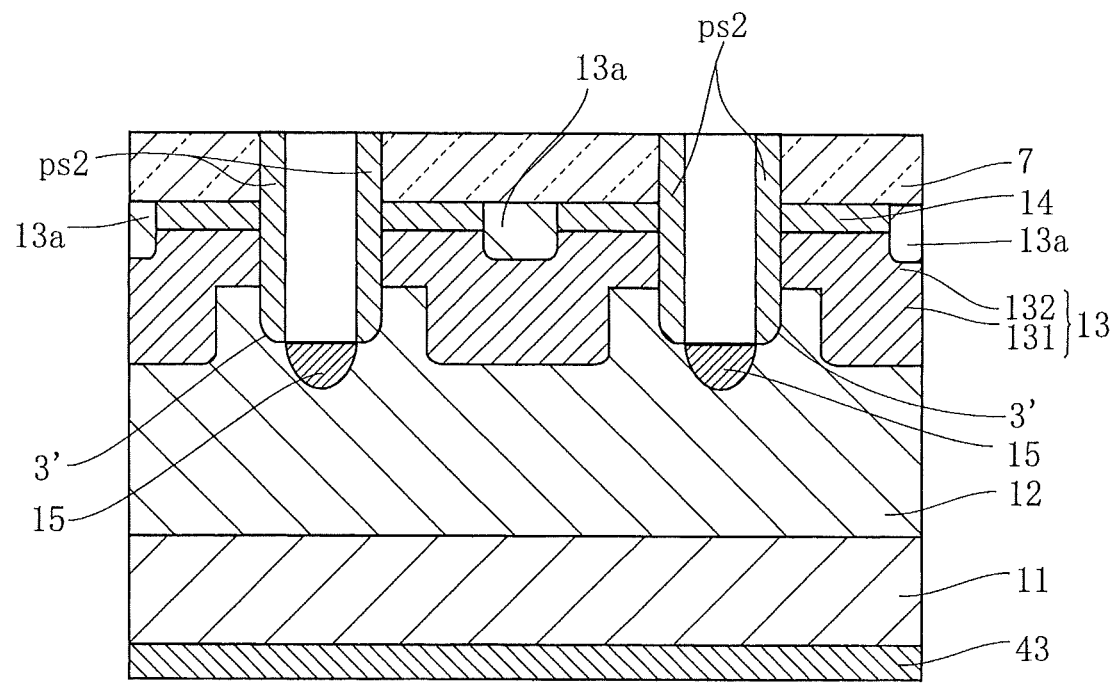
FIG. 10 is a fragmentary cross-sectional view for explaining a manufacturing process following the state shown in FIG. 9B.

Referring now to FIGS. 8 to 10, an example of the manufacturing method of the semiconductor device A4 will be described hereunder.

Figure 8A:
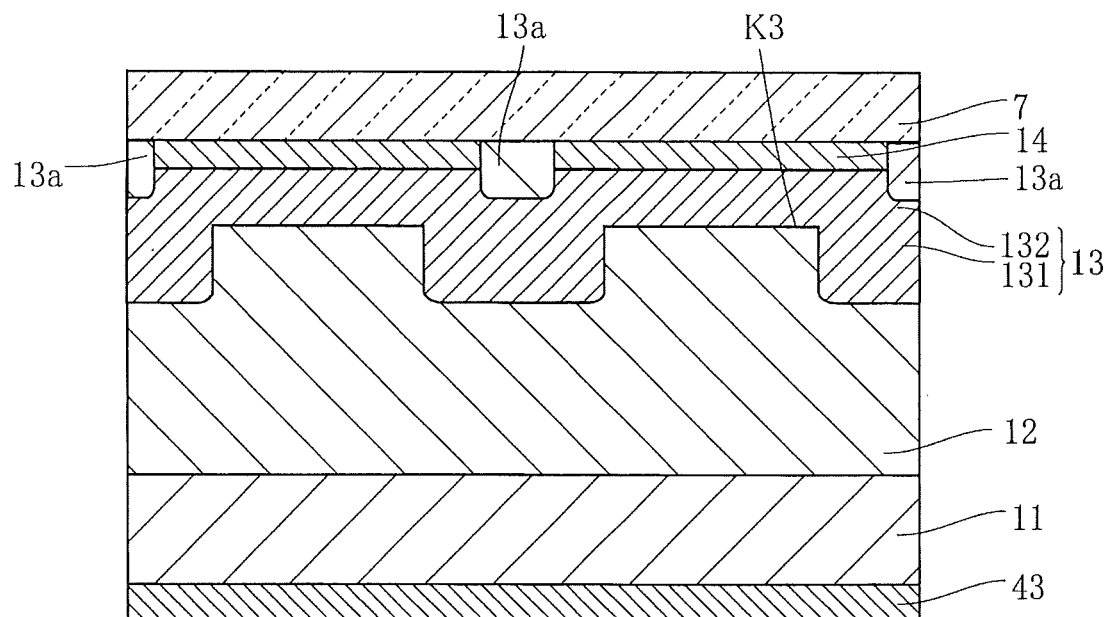
FIG. 8A is a fragmentary cross-sectional view for explaining a manufacturing process following the state shown in FIG. 7.
Figure 8B:
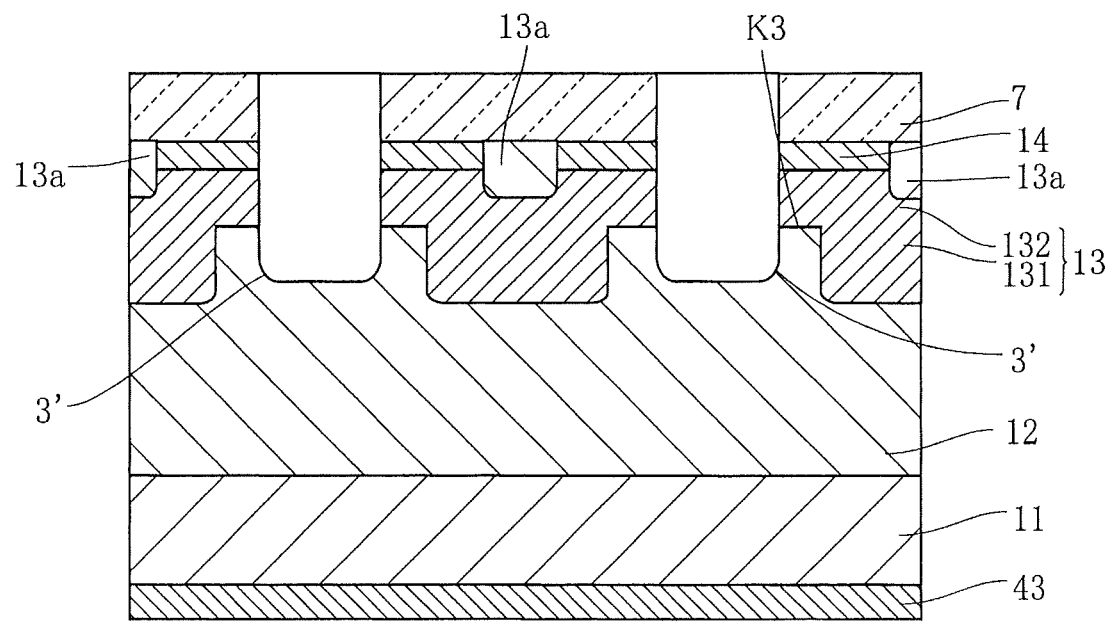
FIG. 8B is a fragmentary cross-sectional view for explaining a manufacturing process following the state shown in FIG. 8A.

The manufacturing method of the semiconductor device A4 is the same as that of the semiconductor device A1 according to the first embodiment, up to the state shown in FIG. 3. Accordingly, the description of the process up to FIG. 3 is not repeated. Referring thus to FIG. 8A, a plasma CVD is performed over the upper surface of the structure shown in FIG. 3, to thereby form a silicon dioxide layer 7. The silicon dioxide layer 7 serves as the mask for forming the trench 3 and the p-type semiconductor region 15, as will be subsequently described. Proceeding to FIG. 8B, a trench 3' is formed so as to penetrate through all of the silicon dioxide layer 7, the n-type semiconductor region 14, and the p-type semiconductor layer 13. The trench 3' is to be formed into the trench 3 shown in FIG. 7. Then the inner wall of the trench 3' is thermally oxidized (not shown).

Then as shown in FIG. 9A, a polysilicon layer ps is formed all over the inner wall of the trench 3' and the upper surface of the silicon dioxide layer 7. Then as shown in FIGS. 9B and 10, a polysilicon layer ps1 and a polysilicon layer ps3 are removed, leaving a polysilicon layer ps2 unremoved. Impurity ions (p-type) are then injected to the bottom portion of the trench 3', as shown in FIG. 10. At this stage, the p-type semiconductor region 15 is formed. Then the entirety of the silicon dioxide layer 7 and the polysilicon layer ps2 are removed. This is followed by the same process as that described in the first embodiment. Thus, the semiconductor device A4 shown in FIG. 7 can be obtained.

The advantageous effects of the semiconductor device A4 will now be described hereunder.

The structure of the semiconductor device A4 allows further mitigating the field concentration on the bottom portion of the trench 3. Accordingly, the withstand voltage of the semiconductor device A4 can be further improved. Here, reducing the size of the p-type semiconductor region 15 in the widthwise direction y allows suppressing an increase in on-resistance.

Figure 11:
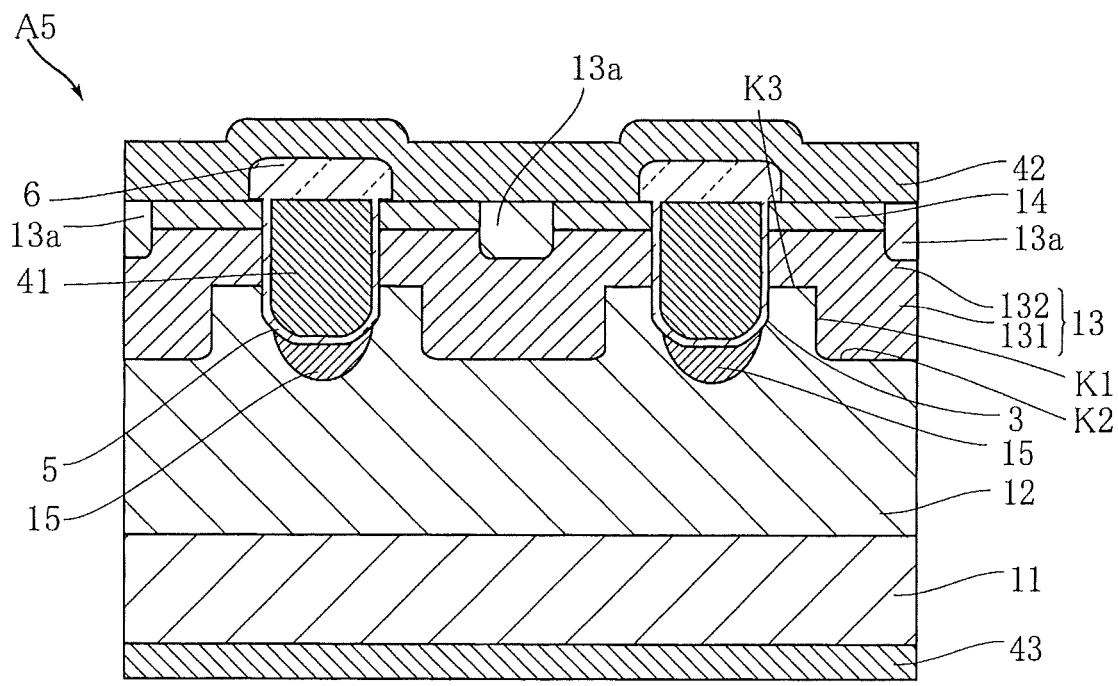
FIG. 11 is a fragmentary cross-sectional view of a semiconductor device according to a fifth embodiment of the present invention.
Figure 12:
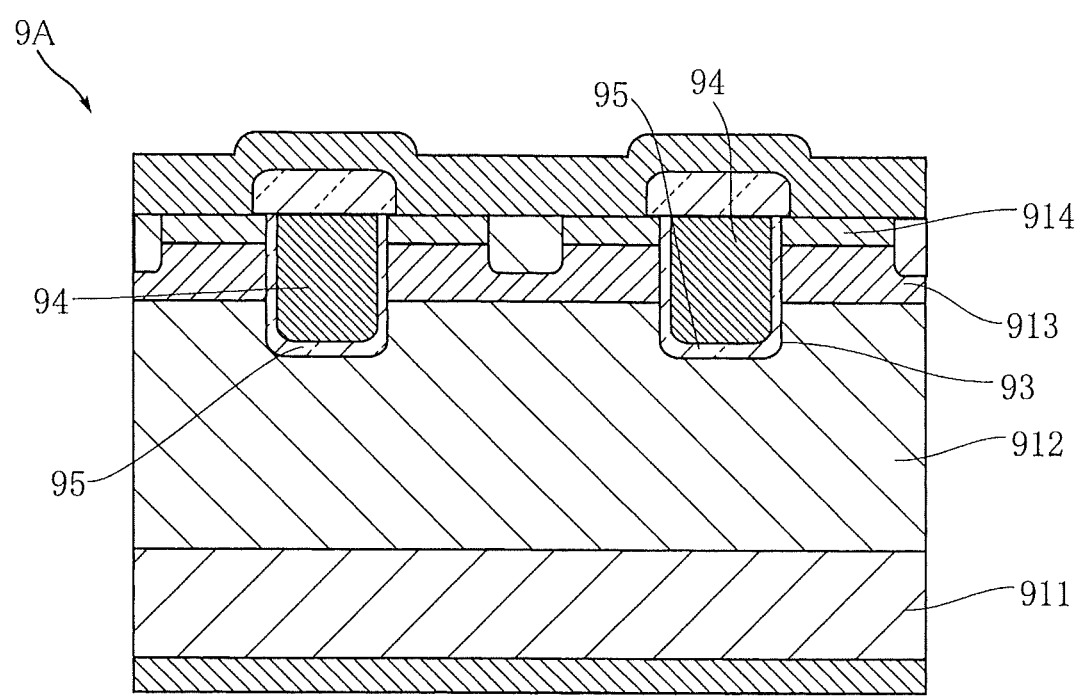
FIG. 12 is a fragmentary cross-sectional view of a conventional semiconductor device.

FIG. 11 illustrates a fifth embodiment of the present invention. In FIG. 11, the constituents same as or similar to those of the foregoing embodiments are given the same numeral. A difference between the semiconductor device A5 according to this embodiment and the semiconductor device A4 according to the fourth embodiment lies in the shape of the trench 3.

As shown in FIG. 11, the additional p-type semiconductor layer 15 is provided so as to cover the bottom portion of the trench 3. Such configuration allows further increasing the withstand voltage. Also, the bottom portion of the trench 3 is formed in a trapezoidal shape. As a result, the additional p-type semiconductor layer 15 can be formed within an area overlapping with the trench 3 in the widthwise direction y. The foregoing structure prevents the flow of electron in the semiconductor device A5 from being disturbed, thereby suppressing an increase in on-resistance. Consequently, the dielectric breakdown electric field can be further increased, while an increase in on-resistance can be suppressed.

The semiconductor device and the manufacturing method of the same according to the present invention are not limited to the foregoing embodiments. Specific structure and arrangement of the semiconductor device and the manufacturing method according to the present invention may be varied in different manners.

The invention claimed is:

1. A semiconductor device comprising:
   a layer of semiconductor having a first face and a second face opposite to the first face, the first face being provided with a first trench;
   a gate electrode provided in the trench; and
   an insulating layer provided in the trench for insulating the layer of semiconductor and the gate electrode from each other;
   wherein the layer of semiconductor includes a first semiconductor layer of a first conductivity type, and a second semiconductor layer of a second conductivity type opposite to the first conductivity type, the second semiconductor layer being generally closer to the first face than is the first semiconductor layer,
   wherein the trench extends through the second semiconductor layer and reaches the first semiconductor layer,
   the second semiconductor layer includes: a close portion close to the second face of the layer of semiconductor; and a sublayer disposed farther from the second face of the layer of semiconductor than is the close portion,
   the second semiconductor layer includes a channel region formed along the trench and in contact with the first semiconductor layer,
   the close portion and the trench are spaced apart from each other so that an upper interface of the close portion is at a same or substantially same height with a lower interface of the channel region, and
   the layer of semiconductor further comprises a semiconductor region of the second conductivity type, the semiconductor region being formed in the first semiconductor layer and extending, in the depthwise direction of the trench, from a bottom portion of the trench toward the second face of the layer of semiconductor beyond a part of the close portion.

2. The semiconductor device according to claim 1, wherein the layer of semiconductor comprises a wide band gap semiconductor.

3. The semiconductor device according to claim 2, wherein the layer of semiconductor is made of SiC.

4. The semiconductor device according to claim 1, wherein a width of the close portion is smaller than half a distance between the first trench and an adjacent second trench.

5. The semiconductor device according to claim 4, further comprising: a source electrode formed on the first face; a source region of the first conductivity type disposed between the source electrode and the sublayer of the second semiconductor layer; and an insulating film formed over the gate electrode, wherein a width of the source region is smaller than a width of the insulating film.

6. The semiconductor device according to claim 5, wherein the insulating film overlaps with the source region.

7. The semiconductor device according to claim 6, wherein a thickness of the source region is smaller than a thickness of the insulating film.

8. The semiconductor device according to claim 7, wherein the layer of semiconductor is formed with a recessed portion overlapping with the close portion as viewed in the depthwise direction of the trench.

9. The semiconductor device according to claim 8, wherein the recessed portion includes a bottom surface facing the close portion and a side surface connected to the bottom surface, and an impurity concentration at the bottom surface is greater than an impurity concentration at the side surface.

10. The semiconductor device according to claim 9, wherein the impurity concentration at the bottom surface is $1\times10^{17}$ cm$^{-3}$~$1\times10^{20}$ cm$^{-3}$ and the impurity concentration at the side surface is $1\times10^{16}$ cm$^{-3}$~$1\times10^{19}$ cm$^{-3}$.

11. The semiconductor device according to claim 10, wherein the recessed portion has an opening that is smaller in size in the widthwise direction than the close portion.

12. The semiconductor device according to claim 11, wherein the first semiconductor layer and the second semiconductor layer define a boundary between them, the boundary including a first bottom boundary formed by a bottom of the close portion and a second bottom boundary close to the trench, and the recessed portion is substantially equal in size in the widthwise direction to the first bottom boundary.

\* \* \* \* \*